(12) United States Patent
Drapkin et al.

(10) Patent No.: US 6,373,282 B1
(45) Date of Patent: Apr. 16, 2002

(54) SINGLE GATE OXIDE CASCADED OUTPUT BUFFER STAGE AND METHOD

(75) Inventors: Oleg Drapkin; Grigori Tempkine, both of Toronto (CA)

(73) Assignee: ATI International Srl, Barbados (KN)

( * ) Notice: Subject to any disclaimer, the term of this patent is extended or adjusted under 35 U.S.C. 154(b) by 0 days.

(21) Appl. No.: 09/379,197

(22) Filed: Aug. 20, 1999

(51) Int. Cl.[7] .................. H03K 19/094; H03K 19/0175
(52) U.S. Cl. ......................... 326/68; 326/80; 326/81; 326/82; 326/83
(58) Field of Search .............................. 326/68, 80, 81, 326/82, 83

(56) References Cited

U.S. PATENT DOCUMENTS

| | | | |
|---|---|---|---|
| 5,300,832 A | * 4/1994 | Rogers | 326/68 |
| 5,467,031 A | 11/1995 | Nguyen et al. | |
| 5,723,987 A | * 3/1998 | Ronen | 326/81 |
| 5,736,869 A | * 4/1998 | Wei | 326/81 |
| 5,933,025 A | * 8/1999 | Nance et al. | 326/81 |
| 5,966,030 A | * 10/1999 | Schmitt et al. | 326/83 |
| 5,969,541 A | * 10/1999 | Waggoner | 326/81 |

FOREIGN PATENT DOCUMENTS

| | | |
|---|---|---|
| EP | 848498 A | 6/1998 |
| EP | 0961206 | 12/1999 |
| GB | 2313968 | 12/1997 |
| WO | WO32228 | 7/1998 |

OTHER PUBLICATIONS

Weste, Neil H.E., and Eshraghian, Kamran, Principles of CMOS VLSI Design A System Perspective,, Addison–Wesley Publishing Company, Second Edition, p. 365 (1993).
European Search Report for Application 00306939.0–2214 dated Aug. 11, 2000.
Patent Abstracts of Japan, vol. 1998, No. 09, Jul. 31, 1998, Publication No. 10105307, published Apr. 24, 1998.

* cited by examiner

*Primary Examiner*—Michael Tokar
*Assistant Examiner*—Steven S. Paik
(74) *Attorney, Agent, or Firm*—Vedder, Price, Kaufman & Kammholz

(57) ABSTRACT

A cascaded output buffer stage and buffering method converts a voltage level of a received internal signal, such as a signal to be output (transmitted) from the cascaded output buffer stage, prior to outputting the received signal; selectively provides a variable reference voltage signal for a cascaded circuit element in the output buffer and also generates a floating well output signal for wells associated the cascaded upper buffer circuit elements. The cascaded output buffer stage is also, in one embodiment, a single gate oxide cascaded output buffer stage. In one embodiment, a voltage level shifting circuit is used along with a variable reference generating circuit that provides a variable reference voltage signal to cascaded output buffer circuits, and that also provides a floating well output signal to wells of the cascaded circuit. The voltage level shifting circuit and variable reference generating circuit is operatively coupled to a cascaded pull up circuit or cascaded pull down circuit as needed.

44 Claims, 4 Drawing Sheets

US 6,373,282 B1

SINGLE GATE OXIDE CASCADED OUTPUT BUFFER STAGE AND METHOD

FIELD OF THE INVENTION

The invention relates generally to output buffer stages, and more particularly to input/output buffer stages that can withstand overvoltage conditions.

BACKGROUND OF THE INVENTION

There is a constant challenge to continuously design smaller, faster and more complicated integrated circuits to provide increased functionality for multimedia applications and other applications. With the continued demand for higher speed and lower power consumption integrated circuits a need exists for simple, low cost and reliable over voltage protection circuits. Graphics controller chips, like many integrated circuit devices, utilize CMOS, logic cores, and associated I/O pads as part of their circuit makeup. I/O pads can include, for example, input/output buffers coupled to a common pad or pin. For example, CMOS based video graphics chips with 128 input/output ports (I/O ports) are required to operate at clock speeds of 125 MHz to 250 MHz or higher. Such devices may use a 2.5 V or 1.8 V power supplies for much of their logic to reduce power consumption. One way to increase the operating speed of such devices is to decrease the gate length of core circuitry transistors. However, a decrease in the gate length and gate oxide thickness of MOS devices can reduce safe operating voltage to lower levels.

For example, where an integrated circuit contains digital circuitry that operates from a 2.5 V source and is fabricated using silicon dioxide gate thickness of 50 Angstroms, a resulting safe operating voltage may be approximately 2.8 V. Such IC's must often connect with more conventional digital devices that operate at 5 V or 3.3 V. A problem arises when the core logic circuitry (operating at 1.8 V) receives 5 V digital input signals from peripheral devices on input pins (or I/O pins). Such standard 5 V input signals or 3.3 V input signals can cause damage if suitable voltage protection is not incorporated.

As smaller gate oxide thicknesses are used to increase the speed and density of integrated circuits, transistors must withstand varying supply voltage operating ranges. For example, external circuits may provide 5 V input signals during normal operating modes. Although a combination of thick gate and thin gate devices can make it easier to design circuitry, it introduces another gate thickness and increases the number of processing steps required to fabricate the IC. This adds to the expense of the integrated circuit. In addition, dual gate oxide circuits such as those using 1.8 V or 3.3 V supply voltages typically cannot withstand a 5 V signal during normal operation.

Also, I/O buffers may receive an input signal of, for example, 5 V or more, on a same pin or pad that is connected to the output buffer stage. With smaller gate oxide thicknesses, the safe gate to drain and safe gate to source voltages decreases. Accordingly, traditional cascaded output buffer stages can be damaged when the I/O pin or pad receives an input signal that is much higher than an I/O pad supply voltage or a supply voltage to internal core circuitry. Also, conventional I/O buffers are tristated the output buffer stage when the I/O buffer is configured to receive data. These conventional I/O buffers typically have pull up or pull down circuits that are typically achieved using pmos transistor or cascaded nmos transistor configurations. Where voltage protection is provided, such as clamp diodes, unnecessary draw current can result when the pad is sent an input signal, such as 5 V, from another circuit for a continued length of time. In addition, cascaded configurations may be inadequate where signals that are being sent from the core through the buffer stage are at a lower level than the buffer stage supply voltage. The voltage difference may be such that an unsuitable threshold drop across a transistor gate to drain or gate to source paths are inadequate to properly shut off an output buffer circuit.

Conventional cascaded output buffers also typically use constant reference voltages for gates of the cascaded transistors. Moreover, with a 5 V input, and a much lower buffer supply voltage, for example, the constant voltage references need to be large enough to avoid gate to drain and gate to source overvoltages of the cascaded transistors. Also, for transmission or output of data from the output buffer, the drive strength of pull up circuits may not be strong enough due to the low supply voltages of either the core supply voltage or the I/O buffer supply voltage. In addition, it would be desirable to have a suitable output buffer stage that utilized single gate oxide elements to improve fabrication costs and wafer yields.

Accordingly, there exists a need to avoid excessive gate to source and gate to drain overvoltage conditions in cascaded stages of an output buffer.

BRIEF DESCRIPTION OF THE DRAWINGS

The disclosed invention will be more readily understood in view of the following drawings wherein.

DETAILED DESCRIPTION OF A PREFERRED EMBODIMENT OF THE INVENTION

Briefly, a cascaded output buffer stage and buffering method converts a voltage level of a received signal from the core, such as a signal to be output (transmitted) from the cascaded output buffer stage, prior to outputting the received signal; selectively provides a variable reference voltage signal for a cascaded circuit element in the output buffer and also generates a floating well output signal for wells associated the cascaded upper buffer circuit elements. The cascaded output buffer stage is also, in one embodiment, a single gate oxide cascaded output buffer stage. In one embodiment a voltage level shifting circuit is used along with a variable reference generating circuit that provides a variable reference voltage signal to cascaded output buffer circuits, and that also provides a floating well output signal to wells of the cascaded circuit. The voltage level shifting circuit and variable reference generating circuit is operatively coupled to a cascaded pull up circuit or cascaded pull down circuit as needed.

Figure 1:
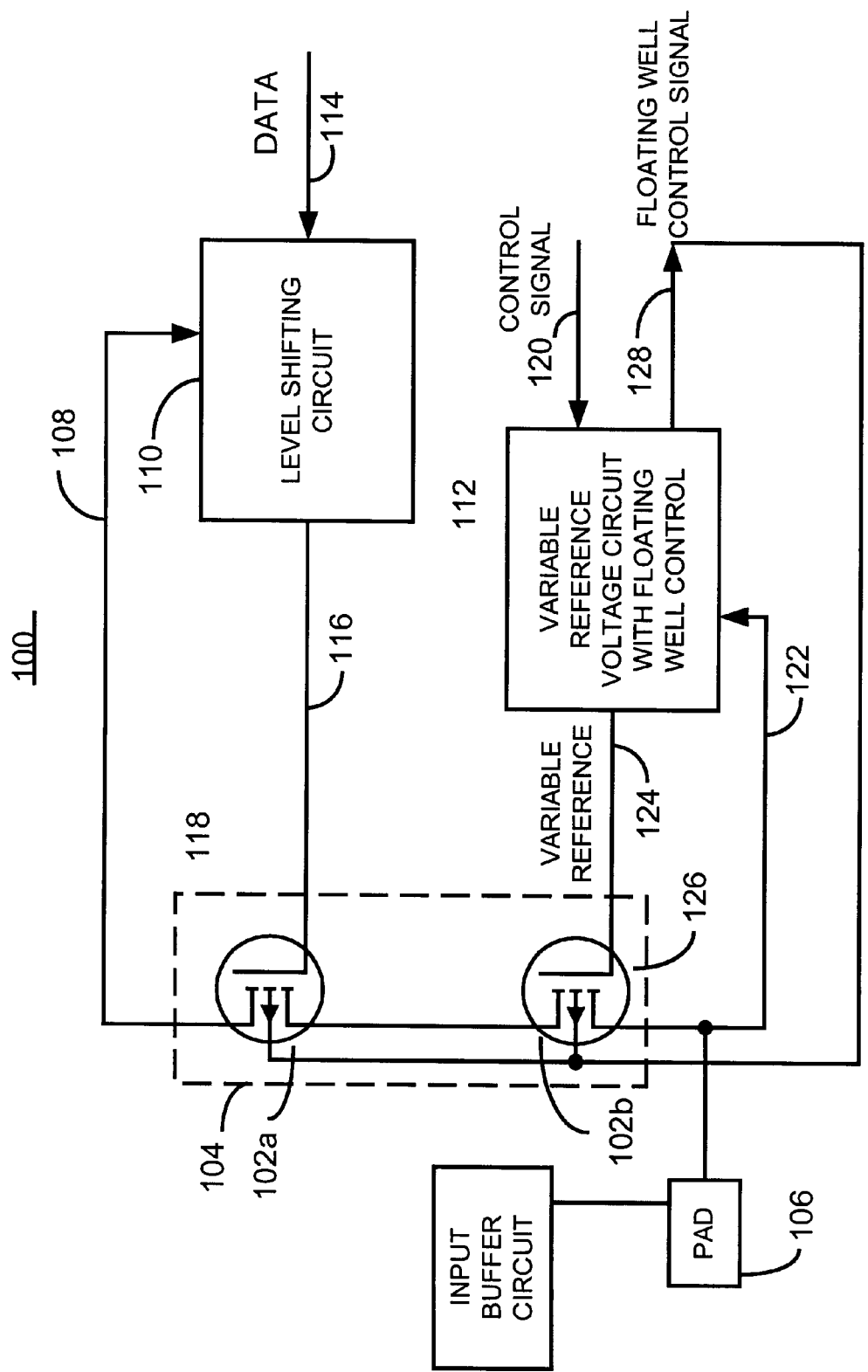
FIG. 1 is a block diagram illustrating one embodiment of a cascaded output buffer stage in accordance with one embodiment of the invention.

FIG. 1 illustrates a portion of a cascaded output buffer stage 100 having cascaded elements 102, shown as a cascaded pull up circuit 104. In this embodiment, the pull up circuit includes a first pmos transistor 102a and a second pmos transistor 102b that are connected in a cascaded fashion. The cascaded pull up circuit 104 is operatively coupled to an input/output pad 106 to which an input buffer is connected (not shown). The cascaded pull up circuit 104 is operatively coupled to an output buffer supply voltage 108. The cascaded output buffer stage 100 also includes a voltage level shifting circuit 110 and a variable reference generating circuit 112. The voltage level shifting circuit is operatively coupled to receive a received signal 114, such as data signal from core logic. The level shifting circuit 110 converts a voltage level of the received signal 114 to a shifted level signal 116 which is provided to a first input 118 of the cascaded pull up circuit 104.

The variable voltage reference generating circuit 112 is responsive to a control signal 120, such as an output enable signal, and is also responsive to an input signal 122 which is received through the I/O pad 106. The variable reference voltage generating circuit 112 selectively provides a variable reference voltage signal 124 to a second input 126 of the cascaded pull up circuit. In addition, the variable reference voltage generating circuit 112 generates a floating well output signal 128 for at least a well associated with the cascaded pull up circuit 104.

The level shifting circuit 10 shifts the received signal 114 as a function of the output buffer supply voltage 108 that supplies voltage to pull up circuit 104. Accordingly, if different supply voltages are used, the level shifter shifts the level of the data to be output from the buffer, to a suitable level to ensure that the gate to drain and gate to source voltages first pmos transistor 102a are within normal operating ranges when the output buffer is transmitting data.

The variable reference voltage generating circuit 112 outputs the variable reference voltage 124 continuously and dynamically adjusts the variable voltage reference signal 124 in response to both whether the output buffer has been selected to enable the transmission of data, or when the output buffer stage has effectively been put in the tristate mode so that the input buffer can receive data. As such, the variable reference voltage generator 112 dynamically varies the variable reference voltage 124 in response to the control signal 120, such as during the transmit mode, and based on the input signal 122, for example, when the I/O buffer is put in the receive mode.

Figure 2:
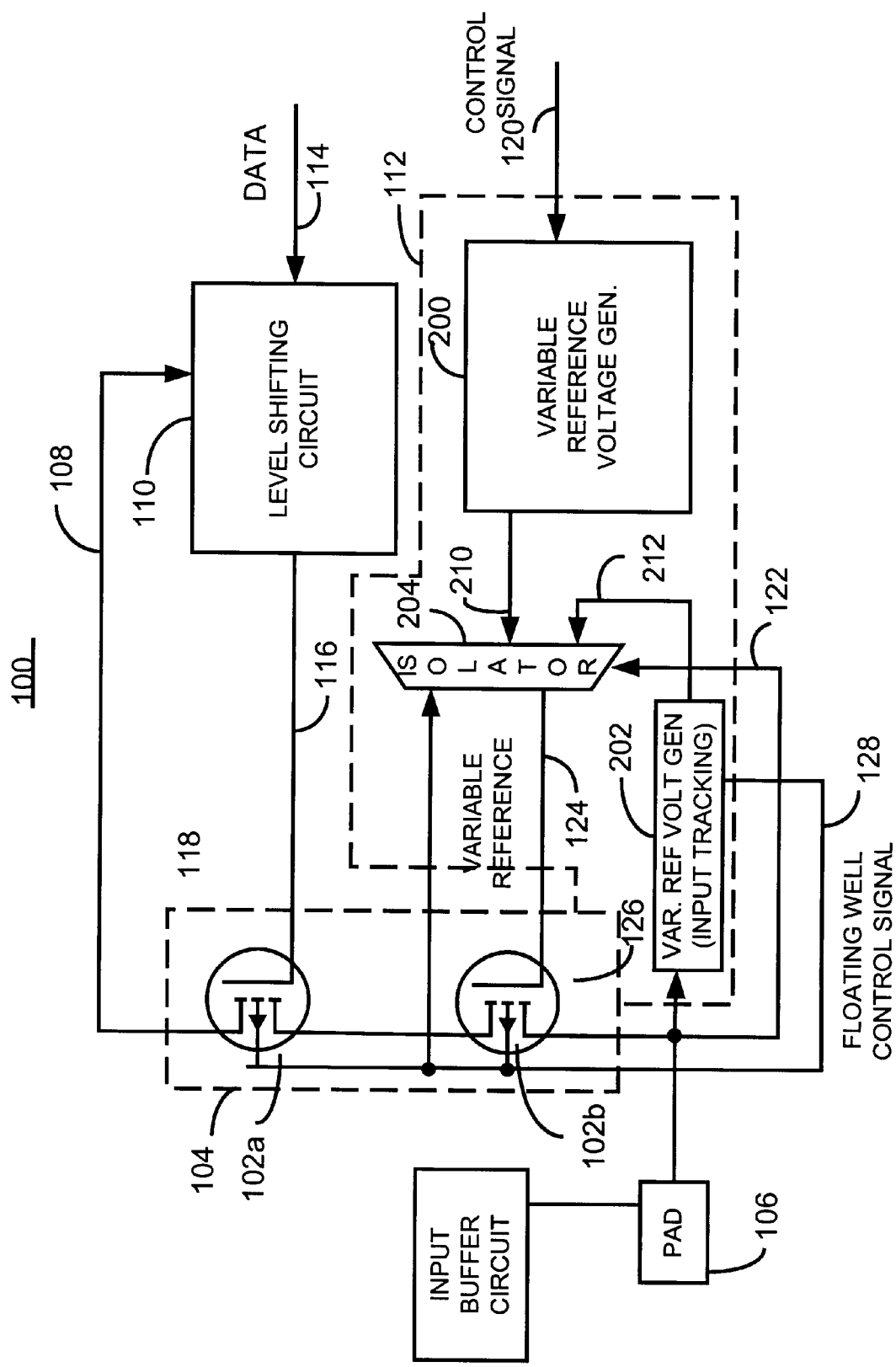
FIG. 2 is a block diagram illustrating one example of the cascaded output buffer stage of FIG. 1.

FIG. 2 illustrates a more detailed embodiment of the variable reference voltage generating circuit 112. The variable reference generating circuit 112, in this example, includes a plurality of variable reference generating circuits 200 and 202, and an isolation circuit 204. The variable reference voltage generating circuit 112 provides the variable reference voltage 124 for the cascaded pull up circuit 104 from one of the plurality of variable reference voltage generating circuits 200 or 202, based on whether the output buffer stage is enabled for outputting data. This may be done, for example, through control signal 120 which may be, for example, an output enable signal as known in the art. In addition, the isolation circuit 204 may isolate the variable reference voltage circuit 200 when the pad voltage 122 reaches a certain level when an output buffer is tri-stated. In this latter case, the variable reference voltage 124 is controlled by the variable reference voltage generating circuit 202.

The variable reference generating circuit 200 is responsive to the control signal 120 to provide a transmit reference voltage 210 which is effectively passed as the reference voltage 124 by the isolation circuit when the isolation circuit is allowed to pass the reference voltage through. This is typically done when the output buffer stage is enabled for outputting data. The variable reference generating circuit 202 is operatively coupled to dynamically vary the variable reference voltage 124 as a function of the input voltage 122 when the cascaded output buffer stage is not enabled for outputting data, such as when the output buffer is tristated.

The isolation circuit 204 is operatively coupled to the plurality of variable reference voltage generating circuits 200 and 202 to selectively isolate one of the variable reference generating circuits 200 or 202 depending upon, for example, the level of the input voltage 122 and/or whether the output buffer has been enabled to output data.

The variable reference generating circuit 202 effectively tracks the input voltage when the I/O buffer is in a receive mode. In this embodiment, the variable reference generating circuit 202 also includes a floating well control circuit to generate the floating well output signal 128. The variable reference generating circuit 202 generates a receive variable reference signal 212 which is effectively passed through the isolation circuit 204 to serve as the reference voltage 124 when the I/O buffer is in the receive mode. Also as shown, the floating well output signal 128 is also provided to circuit wells of the isolation circuit 204.

In operation, when the I/O buffer is in the receive mode, as set by the control signal 120, the variable reference voltage 124 is controlled to be about 2 V when the input signal 122 is between 0 V and the buffer supply voltage level. For purposes of illustration only, the buffer supply voltage may be, for example, 3.3 V, and the core supply voltage may be, for example, 2.5 V. During the receive mode, the floating well output signal 128 is controlled to be approximately the output buffer supply voltage of 3.3 V. When the input voltage exceeds the buffer supply voltage plus threshold voltage drops across the cascaded circuit elements, the variable reference voltage 124 is controlled to be approximately equal to the input voltage, by the voltage reference generating circuit 202. The floating well output signal 128 is also controlled to be approximately equal to the level of the input signal 122.

In a transmit mode, such as when the I/O buffer is enabled to send output data, the reference voltage 124 is controlled to be approximately one threshold voltage drop (VTP) of approximately 1 V for the buffer supply voltage 3.3 V, by the variable reference generating circuit 200. Where, for example, the buffer supply voltage is 2.5 V, the reference voltage 124 may be, for example, 0 V. The floating well output signal 128 is controlled to be approximately equal to the output buffer supply voltage.

Figure 3:
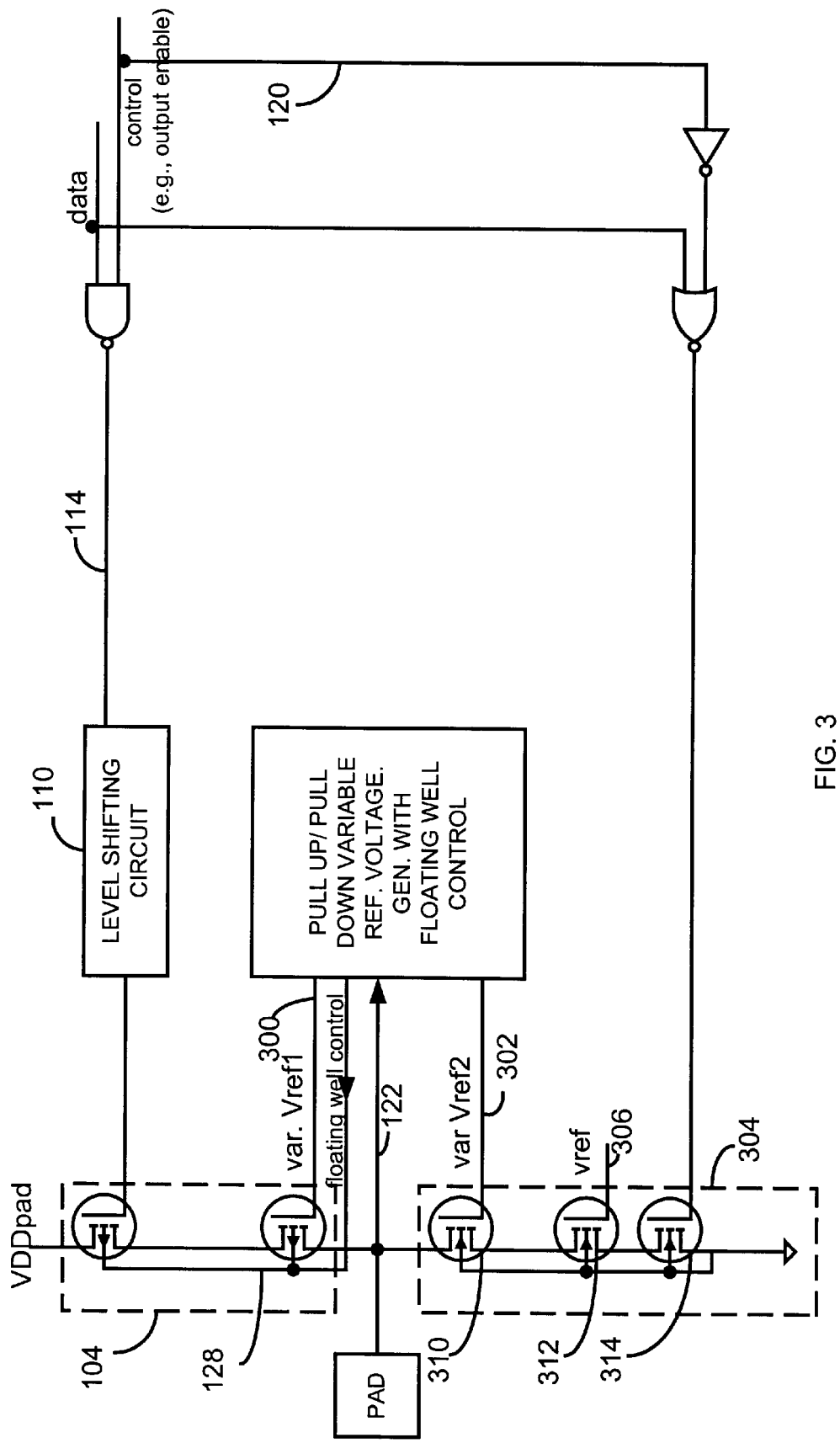
FIG. 3 is a block diagram illustrating one embodiment of a cascaded output buffer stage for pull up and pull down cascaded circuits in accordance with one embodiment of the invention.

FIG. 3 illustrates an alternative embodiment showing an output buffer stage that includes a pull up circuit and pull down circuit based variable reference control circuit 301 so that a plurality of variable reference voltages 300 and 302 are generated. Variable reference voltage 300 is controlled for the pull up circuit 104 and variable reference voltage 302 is controlled for the pull down circuit 304. A constant reference voltage 306 may also be used as shown. The pull up circuit and pull down circuit variable reference voltage control circuit 301 also generates the floating well output signal for all suitable wells of the cascaded device of the pull up circuit and any other suitable circuits as described and shown herein. It will also be recognized that fewer or more elements may be cascaded to provide additional output buffer flexibility and also to accommodate differing supply voltages, and input and output level voltages. NMOS transistor 310, has a gate operatively coupled to receive the variable reference voltage 302 and is cascaded with NMOS transistors 312 and 314 as shown. NMOS transistor 312 receives the constant reference voltage 306. The NAND gate, NOR gate and inverter are conventionally coupled to provide transmission of data from the output buffer.

Figure 4:
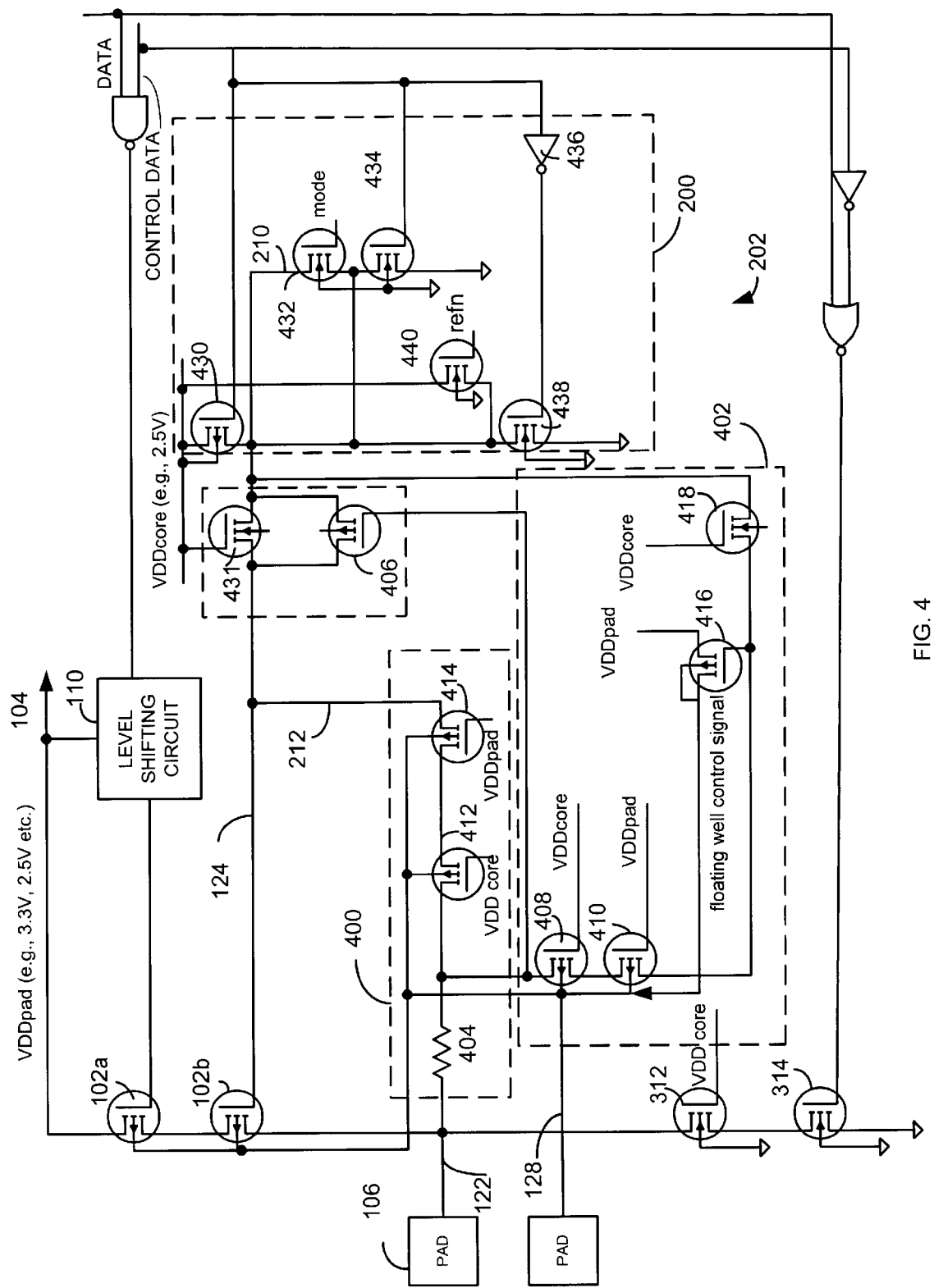
FIG. 4 is a schematic illustrating one example of the cascaded output buffer stage shown in FIG. 2.

Referring to FIG. 4, the circuit of FIG. 2 is shown in more detail. The variable reference generating circuit 202 is shown to include an input voltage tracking circuit 400 and a floating well control circuit 402. The floating well circuit 402 receives the input signal 122 (when the buffer is in receiving mode) through isolation resistor 404, and provides the floating well output signal 128 for wells of the cascaded circuit elements 102a, 102b, elements of the isolation circuit, namely transistor 406, and circuit elements 408 and 410 of the floating well control circuit, along with circuit elements 412 and 414 of the input signal tracking circuit 400. When the output buffer is in transmit mode, the floating well output signal 128 has output buffer voltage supply potential with the help of signal 210 that makes "on" PMOS transistor 416. The variable reference voltage circuit 400 has circuit elements 412 and 414 that include a first PMOS transistor having a source, gate and drain wherein the source is operatively coupled to receive the input signal; and a second PMOS transistor having a source operatively coupled to the drain of the first PMOS transistor and a drain operatively coupled to an input of the cascaded pull up circuit. The wells of each of the first and second pmos transistors are operatively coupled to the floating well output signal.

The floating well control circuit 402 varies the floating well output signal 128 as a function of the input signal 122. The floating well control circuit 402 includes, in this embodiment, PMOS transistors 408 and 410 coupled in a cascade configuration, and also includes PMOS transistor 416 having a gate operatively coupled to the source of PMOS transistor 410 and to a drain wherein to a drain of NMOS transistor 418. The PMOS transistor 416 includes a drain for outputting the floating well control signal and the source coupled to the buffer supply voltage 104. The NMOS transistor 418 has a gate coupled to a static voltage such as the core supply voltage such as 2.5 V. The source of NMOS transistor 418 is operatively coupled to the variable reference voltage generating circuit 200 and to the isolation circuit 204. PMOS transistors 408 and 410 are cascaded to protect against overvoltage conditions to protect when the input voltage is 0 V, for example. For example, PMOS transistor 408 protects PMOS transistor 410 when the input signal 122 is 0 V (without PMOS transistor 408 PMOS transistor 410 will be damaged when the input signal 122 is 0 V and the supply voltage 104 is 3.3 V because, as was mentioned above, for single gate oxide 50 Angstroms transistors the safe operating gate/source and gate/drain voltage is 2.8 V) . In the transmit mode, PMOS transistor 418 and PMOS transistor 416 are on, providing the floating well output signal level approximately equal to the supply voltage 104.

The input voltage tracking circuit 400 effectively tracks the input voltage so that when it increases to a suitable level, the input voltage level is effectively provided as the vehicle voltage reference signal to protect transistor 102b from the overvoltage conditions. During the transmit mode, for example, pmos transistor 414 is off and pmos transistor 412 protects pmos transistor 414 from overvoltage conditions when the input level is 0 V, for example.

The voltage level shifting circuit 110 also includes single gate oxide devices and may be, for example, any suitable level shifting circuit. One example of such a level shifting circuit may be found, for example, in co-pending application Ser. No. 09/211496. The application has as inventors Oleg Drapkin et al. and was filed on Dec. 14, 1998, and incorporated herein by reference. The voltage level shifting circuit is operative to provide, for example, low logic level 0 V when VDDpad supply voltage is, for example, 2.5 V. When the VDDpad supply voltage is, for example, 3.3 V, the level shifting circuit outputs a low level signal of 1 V for PMOS output buffer transistor 212 (signal 114).

The isolation circuit 204 includes a NMOS transistor 431 and PMOS transistor 406. The isolation circuit 204 serves as a type of analog multiplexing circuit which passes transmit reference voltage 210 when the I/O buffer is in a transmit mode, and passes the input voltage 122 when the input/output buffer is selected for the receive mode.

The variable reference voltage generating circuit 200 includes PMOS transistor 430, NMOS transistor 432, NMOS transistor 434, inverter 436, PMOS transistor 438, and NMOS transistor 440. The PMOS transistor 430 is operatively coupled to receive the control signal, such as an output enable signal as input. NMOS transistor 434, as well as the inverter 436, also receives the control signal. Transistors 432 and 434 are connected in the cascaded arrangement. NMOS transistor 440 has a gate coupled to a reference voltage which may be changed depending upon the value of the supply voltage 104. In one example, the reference voltage may be, for example, 0 V for a supply voltage of 2.5 V, or 1.4 V for a supply voltage of 3.3 V. The NMOS transistor 432 has a gate operatively coupled to receive another control signal that stays constant, for example, depending upon the level of the supply voltage 104. In one example, the control signal level may be 2.5 V for a supply voltage of 2.5 V, or 0 V for a supply voltage of 3.3 V. The transistor 440 provides an active voltage threshold level with transistor 438 when the input/output buffer is set in the transmission mode which facilitates noise prevention. For a higher supply voltage of 3.3 V, for example, the transistor 438, provides a logic zero level of about a VTP for the transmit reference signal 210. For the output buffer voltage supply 2.5 V transistors 432 and 434 provide 0 V reference signal 210 when output buffer is in transmit mode. In receiving mode the potential of reference signal 210 is equal to the core voltage supply value.

When the input/output buffer is in transmit mode, transistors 438 and 431 are "on" so that the transmission reference voltage 210 is effectively passed as the variable reference voltage 124. However, when the output enable control signal is set so that the output buffer is tri-stated, the isolation circuit 204 effectively isolates the variable a reference voltage circuit 200 from the cascaded output or pull up circuit.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A cascaded output buffer stage that receives an internal input signal and provides an output signal, comprising:
   at least one single gate oxide voltage level shifting circuit;
   at least one single gate oxide variable reference generating circuit operatively responsive to a control signal and to the output buffer input signal, to provide a variable reference voltage signal and a floating well output signal; and at least one single gate oxide cascaded pull up circuit operatively coupled to the output of the output buffer, the single gate oxide voltage level shifting circuit and to the variable reference generating signal.

2. The cascaded output buffer stage of claim 1 wherein the variable reference voltage generating circuit provides the variable reference voltage for the cascaded pull up circuit, from one of a plurality of variable reference generating circuits based on whether the output buffer stage is enabled for outputting data.

3. The cascaded output buffer stage of claim 2 wherein the plurality of variable reference generating circuits includes at least a first variable reference generating circuit operatively responsive to the control signal, to provide a reference voltage for a cascaded circuit element when the cascaded output buffer stage is enabled for outputting data.

4. The cascaded output buffer stage of claim 2 wherein the plurality of variable reference generating circuits includes a second variable reference generating circuit operatively coupled to dynamically vary the variable reference voltage as a function of the input voltage when the cascaded output buffer stage is not enabled for outputting data.

5. The cascaded output buffer stage of claim 4 wherein the second variable reference generating circuit includes:
a first pmos transistor having a source, gate and drain wherein the source is operatively coupled receive the input signal; and
a second pmos transistor having a source operatively coupled to the drain of the first pmos transistor and a drain operatively coupled to an input of the cascaded pull up circuit,
and wherein wells of each of the first and second pmos transistors are operatively coupled to the floating well output signal.

6. The cascaded output buffer stage of claim 2 wherein the at least one single gate oxide variable reference generating circuit includes an isolation circuit operatively coupled to selectively isolate the plurality of variable reference generating circuits.

7. The cascaded output buffer stage of claim 6 wherein the variable voltage generating circuit includes a floating well control circuit, operatively responsive to the input signal, that varies the floating well output signal for wells of at least some of the cascaded circuit elements and for at least one well of the isolation circuit as a function of the input signal level.

8. The cascaded output buffer stage of claim 1 wherein the voltage level shifting circuit shifts a signal to be output, as a function of a buffer stage supply voltage that is operatively supplying voltage to the pull up circuit.

9. The cascaded output buffer stage of claim 1 wherein the variable voltage generating circuit includes a floating well control circuit, operatively responsive to the input signal, that provides the floating well output signal for wells of at least some of the cascaded circuit elements.

10. The cascaded output buffer stage of claim 9 wherein the floating well control circuit varies the floating well output signal as a function of the input signal.

11. The cascaded output buffer stage of claim 9 wherein the floating well control circuit is operatively coupled to the cascaded pull up circuit.

12. The cascaded output buffer stage of claim 1 wherein the cascaded pull up circuit includes a first input operatively coupled to receive the variable reference voltage and a second input operatively coupled to receive a shifted level signal from the at least one single gate oxide voltage level shifting circuit.

13. The cascaded output buffer stage of claim 12 wherein the cascaded pull up circuit is comprised of:
at least a first pmos transistor having a gate operatively coupled to the shifted level signal, a drain operatively coupled to a supply voltage for the cascaded circuit elements and a source, and
at least a second pmos transistor having a gate operatively coupled to receive the variable reference voltage, a drain coupled to the source of the first pmos transistor, and a source operatively coupled to receive an input signal and to output an output signal,
and wherein wells of each of the first and second pmos transistors are operatively coupled to the floating well output signal.

14. A cascaded output buffer stage that receives an internal input signal and provides an output signal, comprising:
at least one single gate oxide voltage level shifting circuit;
at least one single gate oxide variable reference generating circuit operatively responsive to a control signal and to the input signal, to provide a floating well output signal and a variable reference voltage signal; and
at least one single gate oxide cascaded pull down circuit operatively coupled to the input signal, the single gate oxide voltage level shifting circuit and to the variable reference signal.

15. The cascaded output buffer stage of claim 14 wherein the variable reference voltage generating circuit provides the variable reference voltage for the cascaded pull down circuit, from one of a plurality of variable reference generating circuits based on whether the output buffer stage is enabled for outputting data.

16. The cascaded output buffer stage of claim 15 wherein the plurality of variable reference generating circuits includes at least a first variable reference generating circuit operatively responsive to the control signal, to provide a reference voltage for a cascaded circuit element in the cascaded pull down circuit.

17. The cascaded output buffer stage of claim 15 wherein the plurality of variable reference generating circuits includes a second variable reference generating circuit operatively coupled to dynamically vary the variable reference voltage as a function of the input voltage when the cascaded output buffer stage is not enabled for outputting data.

18. The cascaded output buffer stage of claim 17 wherein the second variable reference generating circuit includes:
a first pmos transistor having a source, gate and drain wherein the source is operatively coupled receive the input signal; and
a second pmos transistor having a source operatively coupled to the drain of the first pmos transistor and a drain operatively coupled to an input of the cascaded pull up circuit,
and wherein wells of each of the first and second pmos transistors are operatively coupled to the floating well output signal.

19. The cascaded output buffer stage of claim 15 wherein the at least one single gate oxide variable reference generating circuit includes an isolation circuit operatively coupled to selectively isolate the plurality of variable reference generating circuits.

20. The cascaded output buffer stage of claim 19 wherein the variable voltage generating circuit includes a floating well control circuit, operatively responsive to the input signal, that varies the floating well output signal for wells of at least some of the cascaded circuit elements and for at least one well of the isolation circuit as a function of the input signal level.

21. The cascaded output buffer stage of claim 14 wherein the voltage level shifting circuit shifts a signal to be output, as a function of a buffer stage supply voltage that is operatively supplying voltage to the pull up circuit.

22. The cascaded output buffer stage of claim 14 wherein the variable voltage generating circuit includes a floating well control circuit, operatively responsive to the input signal, that provides the floating well output signal for wells of at least some of the cascaded circuit elements in the cascaded pull down circuit.

23. The cascaded output buffer stage of claim 22 wherein the floating well control circuit varies the floating well output signal as a function of the input signal.

24. The cascaded output buffer stage of claim 22 wherein the floating well control circuit is operatively coupled to the cascaded pull up circuit.

25. The cascaded output buffer stage of claim 14 wherein the cascaded pull up circuit includes a first input operatively coupled to receive the variable reference voltage and a second input operatively coupled to receive a shifted level signal from the at least one single gate oxide voltage level shifting circuit.

26. The cascaded output buffer stage of claim 25 wherein the cascaded pull up circuit is comprised of:
    at least a first pmos transistor having a gate operatively coupled to the shifted level signal, a drain operatively coupled to a supply voltage for the cascaded circuit elements and a source, and
    at least a second pmos transistor having a gate operatively coupled to receive the variable reference voltage, a drain coupled to the source of the first pmos transistor, and a source operatively coupled to receive an input signal and to output an output signal,
    and wherein wells of each of the first and second pmos transistors are operatively coupled to the floating well output signal.

27. A cascaded output buffer stage that receives an internal input signal and provides an output signal, comprising:
    at least one single gate oxide voltage level shifting circuit;
    at least one single gate oxide variable reference generating circuit operatively responsive to a control signal and to the interval input signal, to provide a floating well output signal and a variable reference voltage signal;
    at least one single gate oxide cascaded pull up circuit operatively coupled to the internal input signal, the single gate oxide voltage level shifting circuit and to the variable reference generating signal; and
    at least one single gate oxide cascaded pull down circuit operatively cascaded with the single gate oxide cascaded pull up circuit, and operatively coupled to the internal input signal, the single gate oxide voltage level shifting circuit and to the variable reference generating signal.

28. The cascaded output buffer stage of claim 27 wherein the variable reference voltage generating circuit provides the variable reference voltage for the cascaded pull up circuit, from one of a plurality of variable reference generating circuits based on whether the output buffer stage is enabled for outputting data.

29. The cascaded output buffer stage of claim 28 wherein the plurality of variable reference generating circuits includes at least a first variable reference generating circuit operatively responsive to the control signal, to provide a reference voltage for a cascaded circuit element when the cascaded output buffer stage is enabled for outputting data.

30. The cascaded output buffer stage of claim 28 wherein the plurality of variable reference generating circuits includes a second variable reference generating circuit operatively coupled to dynamically vary the variable reference voltage as a function of the input voltage when the cascaded output buffer stage is not enabled for outputting data.

31. The cascaded output buffer stage of claim 30 wherein the second variable reference generating circuit includes:
    a first pmos transistor having a source, gate and drain wherein the source is operatively coupled receive the input signal; and
    a second pmos transistor having a source operatively coupled to the drain of the first pmos transistor and a drain operatively coupled to an input of the cascaded pull up circuit,
    and wherein wells of each of the first and second pmos transistors are operatively coupled to the floating well output signal.

32. The cascaded output buffer stage of claim 28 wherein the at least one single gate oxide variable reference generating circuit includes an isolation circuit operatively coupled to selectively isolate the plurality of variable reference generating circuits.

33. The cascaded output buffer stage of claim 32 wherein the variable voltage generating circuit includes a floating well control circuit, operatively responsive to the input signal, that varies the floating well output signal for wells of at least some of the cascaded circuit elements and for at least one well of the isolation circuit as a function of the input signal level.

34. The cascaded output buffer stage of claim 27 wherein the voltage level shifting circuit shifts a signal to be output, as a function of a buffer stage supply voltage that is operatively supplying voltage to the pull up circuit.

35. The cascaded output buffer stage of claim 27 wherein the variable voltage generating circuit includes a floating well control circuit, operatively responsive to the input signal, that provides the floating well output signal for wells of at least some of the cascaded circuit elements.

36. The cascaded output buffer stage of claim 35 wherein the floating well control circuit varies the floating well output signal as a function of the input signal.

37. The cascaded output buffer stage of claim 35 wherein the floating well control circuit is operatively coupled to the cascaded pull up circuit.

38. The cascaded output buffer stage of claim 27 wherein the cascaded pull up circuit includes a first input operatively coupled to receive the variable reference voltage and a second input operatively coupled to receive a shifted level signal from the at least one single gate oxide voltage level shifting circuit.

39. The cascaded output buffer stage of claim 38 wherein the cascaded pull up circuit is comprised of:
    at least a first pmos transistor having a gate operatively coupled to the shifted level signal, a drain operatively coupled to a supply voltage for the cascaded circuit elements and a source, and
    at least a second pmos transistor having a gate operatively coupled to receive the variable reference voltage, a drain coupled to the source of the first pmos transistor, and a source operatively coupled to receive an input signal and to output an output signal,
    and wherein wells of each of the first and second pmos transistors are operatively coupled to the floating well output signal.

40. A method for protecting a cascaded output buffer stage that receives an internal input signal and provides an output signal, comprising the steps of:

converting a voltage level of a received an internal input signal prior to outputting the received signal to a first input of a single gate oxide cascaded pull up circuit;

selectively providing a variable reference voltage signal for a second input of the single gate oxide cascaded pull up circuit, in response to at least one of a control signal and the internal input signal; and generating a floating well output signal for at least a well associated with the single gate oxide cascaded pull up circuit.

41. The method of claim 40 wherein the step of selectively providing the variable reference voltage includes providing the variable reference voltage from one of a plurality of variable reference generating circuits based on whether the output buffer stage is enabled for outputting data.

42. The method of claim 40 including the step of dynamically varying the variable reference voltage as a function of the input voltage.

43. The method of claim 40 including the step of varying the variable reference voltage as a function of an I/O pad supply voltage that is operatively supplying voltage to the pull up circuit.

44. The method of claim 40 wherein the step of generating the floating well output signal includes varying the floating well output signal as a function of the input signal.

* * * * *